United States Patent [19]

Tamura et al.

[11] 4,013,612

[45] Mar. 22, 1977

[54] EPOXY COMPOSITION FOR ENCASING SEMICONDUCTOR DEVICES

[75] Inventors: Tooru Tamura, Ikeda; Nobuyuki Ojima, Katano; Sigeru Kondo, Higashi-Osaka; Jizodo Yozo, Kagoshima, all of Japan

[73] Assignee: Matsushita Electric Industrial Co., Ltd., Japan

[22] Filed: Oct. 15, 1975

[21] Appl. No.: 622,729

[30] Foreign Application Priority Data

Oct. 18, 1974   Japan .............................. 49-120838
Oct. 18, 1974   Japan .............................. 49-120829

[52] U.S. Cl. .......................... 260/37 EP; 260/59 EP
[51] Int. Cl.² ......................................... C08L 63/04
[58] Field of Search ................... 260/37 EP, 59 EP

[56] References Cited

UNITED STATES PATENTS

| 3,394,105 | 7/1968 | Christie | 260/59 EP X |
| 3,507,831 | 4/1970 | Avis et al. | 260/37 EP X |
| 3,838,094 | 9/1974 | Sporck | 260/37 EP |

*Primary Examiner*—Lewis T. Jacobs
*Attorney, Agent, or Firm*—Wenderoth, Lind & Ponack

[57] ABSTRACT

An epoxy resin composition for encasing semiconductive devices comprising a homogeneous mixture of a cresol novolak type epoxy resin and phthalic anhydride as a curing agent, the amount of phthalic anhydride being in excess of the equivalents of epoxide groups, a derivative of imidazole as a curing accelerating agent, and remainder being mineral filler.

4 Claims, 3 Drawing Figures

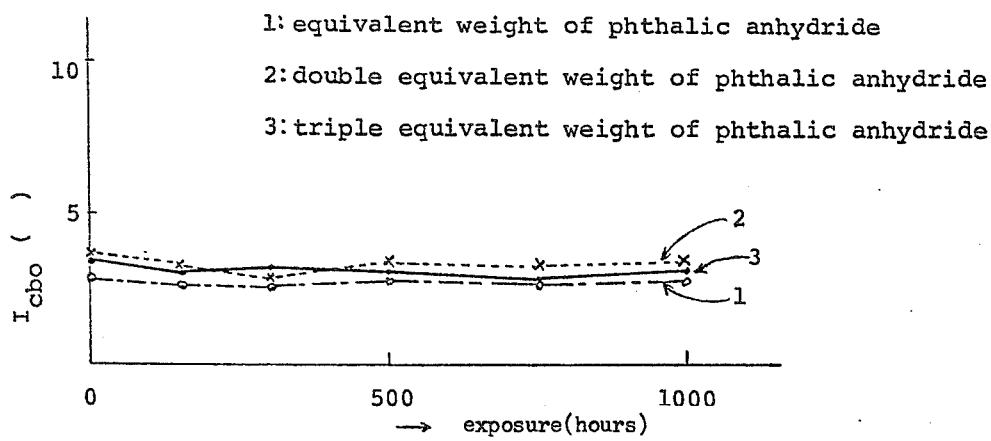
Fig.1: The relation between $I_{cbo}$ and the time during which the transistor is subjected to humidity
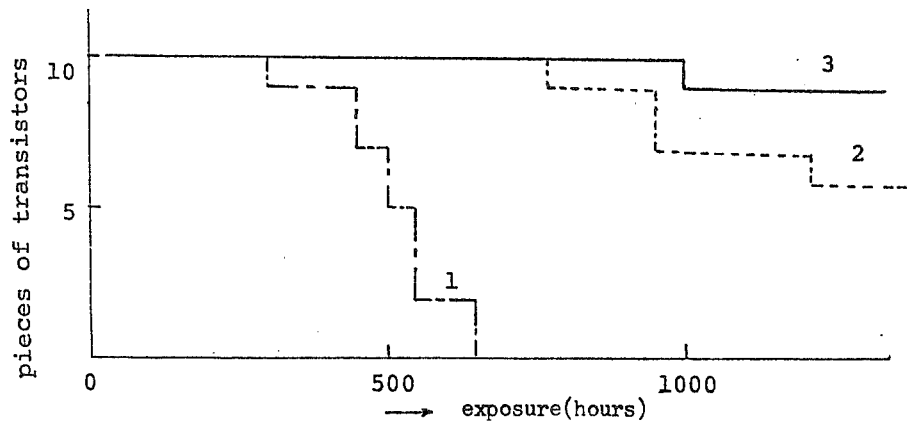
Fig.2: The relation between a number of transistors which have more than 50 volt base-collector impedance and the time of exposure to humidity

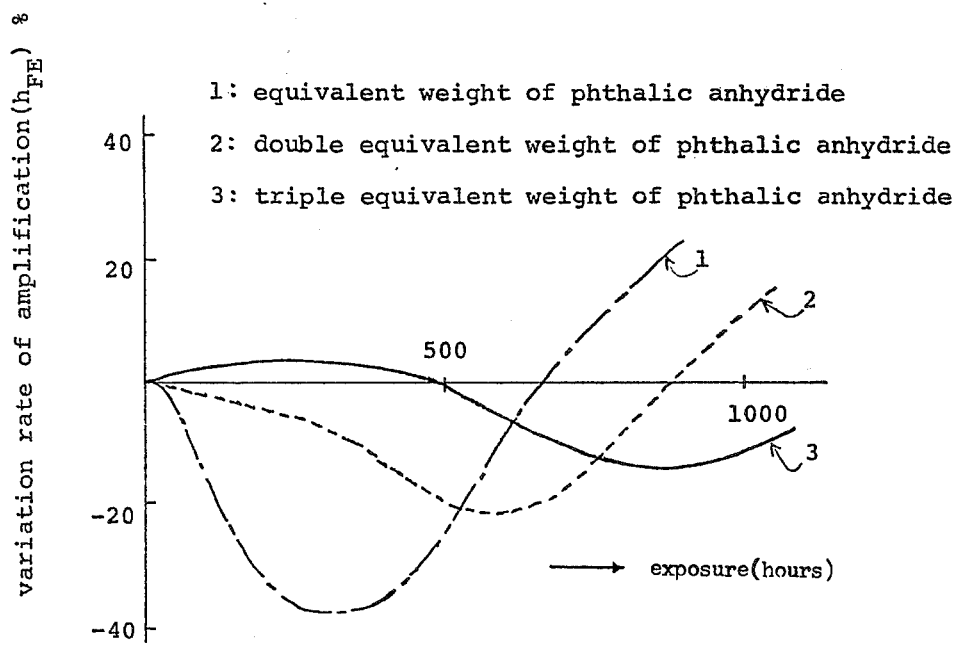
Fig. 3: The relation between the variation rate of $h_{FE}$ and the time while the transistor is subjected to humidity

EPOXY COMPOSITION FOR ENCASING SEMICONDUCTOR DEVICES

This invention relates to a plastic for encasing semiconductor devices, and more particularly to a composition of epoxy resin for ensuring constant characteristics of a semiconductor, especially amplification ($h_{FE}$) and a $p$ to $n$ junction impedance of a germanium transistor.

In order to encase the semiconductor devices, such as a light emission diode and a silicone transistor, various types of epoxy resins have been developed in the prior art. For example, epoxy resins which have aromatic amines as a curing agent have been used. However, these epoxy resins can not be applied to a germanium transistor, because generally, the germanium transistor is very sensitive to a factors such as humidity and alkali and more over it is very difficult to be passivated. Therefore, there is a great need to develop plastics which can be employed to encase the germanium transistor.

Therefore, an object of the present invention is to provide a new composition of epoxy resin which can be employed to encase the germanium transistor.

Another object of the invention is to provide a method of encasing the germanium transistor without degrading the original electrical characteristics thereof.

These objects are realized by providing epoxy resin according to the present invention which comprises novolak type epoxy resin and a phthalic anhydride selected from a group consisting of phthalic anhydride, tetrahydrophthalic anhydride and combinations thereof.

These and other objects and features of the present invention will be apparent upon consideration of the following description taken together with accompanying graphic ilustrations, in which:

FIG. 1 is a graph showing the relation between $I_{CBO}$ and the time for which transistor is subjected to humidity, wherein $I_{CBO}$ is the collector of base current of the transistor when 10 volts is applied reversibly thereto.

FIG. 2 is a graph showing the relation between a number of transistors which have more than 1 megohm base-to-collector impedance and the time for which the transistor is subjected to humidity.

FIG. 3 is a graph showing the relation between the variation rate of $h_{FE}$ and the time for which the transistor is subjected to humidity, wherein $h_{FE}$ is the current amplification of the transistor.

According to the present invention, the transistor potting epoxy resin characterized by high performance and easy workability comprises a homogeneous mixture of 33 to 50 weight percent of novolak type epoxy resin which has an epoxy equivalent weight from 200 to 235 and melting point from 35° to 99° C, 18 to 32 weight percent of phthalic anhydride, 0.03 to 0.3 weight percent of imidazoles which are immiscible with water, and the remainder being mineral filler.

The epoxy resin composition of the present invention can be applied to any kind of semiconductor devices, and the effect of the present invention is especially large for a germanium transistor and a compound semiconductor which is difficult to passivate and which is very sensitive to humidity. An embodiment of the invention will be described for a germanium transistor such as 2SA-101 of Matsushita Electronics Corporation of Japan. The transistor 2SA-101 consists essentially of n-type germanium and indium as major elements with additive elements of antimony and barium, and it is manufactured by an alloying method.

In order to evaluate the characteristics of the plastic sealed transistor, the cut off current ($I_{CBO}$) between collector and base, the impedance between collector and base ($-V_{CBO}$) and the variation of amplification ($h_{FE}$) are observed. Practically, the change of these characteristics under humidity test is observed. The cut off current ($I_{CBO}$) is the current when the voltage of 10 volts is reversibly applied between collector and base. The impedance of collector to base is substituted as the reverse voltage at which the current of 50$\mu$A is observed between them. The amplification ($h_{FE}$) is defined at the conditions of base current of 10$\mu$A($-I_B$=10$\mu$A) and the voltage of $-6$ volt applied between emitter and collector ($-V_{CE}$=6V). An embodiment of the invention is now described in the following, in which all values of $I_{CBO}$, $h_{FE}$, $-V_{CBO}$ are the mean values of 10 pieces of transistors. Among these three characteristics, the variation of $h_{FE}$ is the most sensitive to the humidity test.

EXAMPLE 1

The transistor 2SA-101 was rinsed with plenty of running distilled water, and dipped in dioxane in order to the water with dioxane. Then, the transistor was dipped in silicone resin ES-1001N (Shinetsu Silicone Co., Japan) and baked at 90° C for 4 hours. The thus treated transistor was encased in a metal case with epoxy resin having the following composition;

| | |
|---|---|
| cresol novolak type epoxy resin ECN-1280 (Ciba Co., Switzerland) (an average epoxide equivalent weight of 230) | 100 weight parts |
| phthalic anhydride (The equivalents of epoxide group) | 31.5 weight parts |
| 2-phenyl imidazole | 0.6 weight part |
| quartz powder | 100 weight parts |

The cresol novolak resin used in this invention has the following general molecular formula:

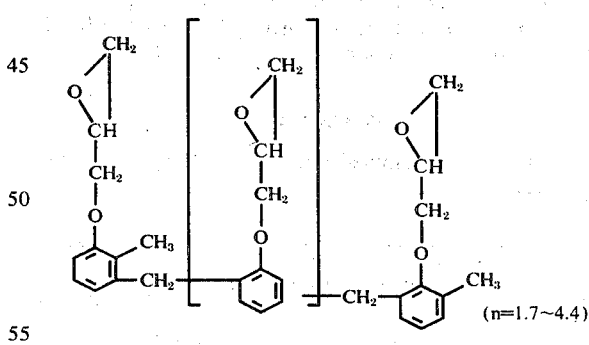

and, as its typical characteristics, it has an average molecular weight of 1170, a number of $n$ of 4.1, and a melting point of 80° C.

After the cresol novolak type epoxy resin and the fused silicone dioxide were introduced in rolling mill and melted at 120° C, the phthalic anhydride was added and mixed well. Then, thhe mixture was admixed further with 2-phenyl imidazole. The resultant epoxy resin composition was a light yellowish solid after cooling. It was pulverized to a particle size of 32 to 80 mesh, and the powder was molded into a pellet which was suitable for potting the transistor.

The potting procedure of the transistor was carried out by steps of providing a metal cap, heating the metal cap to a temperature from 80° to 120° C, putting the pellet in this cap, melting the pellet, inserting the transistor into the cap, and curing the epoxy resin for 16 hours. The preferred temperature for curing the epoxy resin was experimentally confirmed as being from 80° to 120° C.

The electrical characteristics of the thus sealed transistor were stable at room temperature. That is, $I_{CBO}$ was below 2.8μA, $-V_{CBO}$ was above 130V and $h_{FE}$ was above 45, and all these electrical characteristics scacely changed even under the humidity test, as shown in FIG. 1 and FIG. 2. The variation of $h_{FE}$ under humidity is shown in FIG. 3.

EXAMPLE 2

The following composition was used to encase the transistor.

| | |
|---|---|
| cresol novolak type epoxy resin ECN-1280 (an average epoxide equivalent weight of 235) | 100 weight parts |
| phthalic anhydride (two times as much as the equivalents of epoxide groups) | 63 weight parts |
| 2-phenyl imidazole | 0.6 weight part |
| quartz powder | 100 weight parts |

After the cresol novolak type epoxy resin and the fused silicone dioxide were introduced in rolling mill and melted at 120° C, the phthalic anhydride was added and mixed well. Then, the mixture was admixed further with 2-phenyl imidazole. The resultant epoxy resin composition was light yellowish solid after cooling. It was pulverized to the particle size of 32 to 80 mesh, and the powder was a molded into a pellet which was suitable for potting a transistor. The potting procedure was similar to that of Example 1.

The electrical characteristics of the thus encased transistor was stable at room temperature. That is, $I_{CBO}$ was below 3.8μA, $-V_{CBO}$ was 135 volt and $h_{FE}$ was 48, and all these characteristics scarcely changed even under the humidity test, as shown in FIG. 1 and FIG. 2. The variation of $h_{FE}$ under the humidity test is shown in FIG. 3.

EXAMPLE 3

The following composition was used to encase the transistor.

| | |
|---|---|
| cresol novalac type epoxy resin ECN-1280 (an average epoxide equivalent weight of 230) | 100 weight parts |
| phthalic anhydride (three times as much as the equivalents of epoxide groups weight) | 94.5 weight parts |
| 2-phenyl imidazole | 0.6 weight part |
| quartz powder | 100 weight parts |

The composition was processed similarly to Examples 1 and 2, and the transistor was encased by the similar potting procedure to that of Examples 1 and 2.

The electrical characteristics of the thus encased transistor are shown in FIGS. 1, 2 and 3, wherein $I_{CBO}$ was below 3.5μA, $-V_{CBO}$ was 140 V and $h_{FE}$ was 50.

EXAMPLE 4

The following composition was used to encase the transistor.

| | |
|---|---|
| cresol novolak type epoxy resin ECN-1280 (an average epoxide equivalent weight of 230) | 100 weight parts |
| phthalic anhydride (7/10 times as much as the equivalents of epoxide groups weight) | 22 weight parts |
| 2-phenyl imidazole | 0.6 weight part |
| quartz powder | 100 weight parts |

The composition was processed similarly to the above Examples, and the transistor was encased by a similar potting procedure to that of the above Examples.

The electrical characteristics of the thus encased transistor are shown in FIGS. 1, 2 and 3, wherein $I_{CBO}$ was below 4μA, $-V_{CBO}$ was 110 V and $h_{FE}$ was 47.

The humidity test was carried out at a relative humidity of 95 percent at 70° C, and the most sensitive characteristic was $h_{FE}$, as is evident from the comparison among FIGS. 1, 2 and 3. From FIG. 3, the excess equivalent weight of phthalic anhydride results in little change of $h_{FE}$, but in case of more than triple equivalent weight of phthalic anhydride, it is difficult to get a uniform composition of epoxy resin and good workability. Therefore, the preferred excess amount of phthalic anhydride is 1.5 to 3 times as much as the equivalents of epoxide groups.

Further, the preferred epoxide equivalent weight of the cresol novolak type epoxy resin is 200 to 235. For the value below 200, an epoxy resin is in a liquid state or it is difficult to be molded into a pellet, and for the value above 235 it becomes difficult to melt an epoxy resin.

For the amount of the derivatives of imidazoles and/or the combinations thereof used as the curing accelerating agent, the preferred amount is 0.03 to 0.3 weight percent of the epoxy resin composition. No accelerating of curing is realized with an amount less than 0.03 wt. %, and the acceleration effect is saturated at an amount greater than 0.3 wt. % along with undesirable contamination.

For the amount of the mineral filler, the preferable amount is 40 to 100 wt. % of the epoxy resin composition. An amount of the mineral filler of less than 40 wt. % results in weak improvement of characteristics such as resistance to humidity, and the amount thereof more than 100 wt. % results in difficulty of melting the mineral filler.

What is claimed is:

1. An epoxy resin composition for encasing semiconductive devices comprising a homogeneous mixture of a cresol novolak epoxy resin, phthalic anhydride as a curing agent, the amount of phthalic anhydride being 1.5 to 3 times the equivalents of epoxide groups, a derivative of imidazole as a curing accelerating agent, and the remainder being mineral filler.

2. An epoxy resin composition for encasing semiconductive devices according to claim 1, wherein said cresol novolak epoxy resin has an average epoxide equivalent weight from 200 to 235.

3. An epoxy resin composition for encasing semiconductive devices according to claim 1, wherein the amount of said curing accelerating agent is 0.03 to 0.3 weight percent of said epoxy resin composition.

4. An epoxy resin composition for encasing semiconductive devices according to claim 1, wherein the amount of said mineral filler is 40 to 100 weight percent of said epoxy resin composition.

* * * * *